US010551736B2

(12) United States Patent
Finders et al.

(10) Patent No.: US 10,551,736 B2
(45) Date of Patent: Feb. 4, 2020

(54) METHODS FOR PROVIDING LITHOGRAPHY FEATURES ON A SUBSTRATE BY SELF-ASSEMBLY OF BLOCK COPOLYMERS

(71) Applicant: ASML Netherlands B.V., Veldhoven (NL)

(72) Inventors: Jozef Maria Finders, Veldhoven (NL); Tamara Druzhinina, Eindhoven (NL); Emiel Peeters, Eindhoven (NL); Sander Frederik Wuister, Eindhoven (NL); Christianus Martinus Van Heesch, Eindhoven (NL); Eddy Cornelis Antonius Van Der Heijden, Netersel (NL); Henri Marie Joseph Boots, Best (NL)

(73) Assignee: ASML Netherlands B.V., Veldhoven (NL)

( * ) Notice: Subject to any disclaimer, the term of this patent is extended or adjusted under 35 U.S.C. 154(b) by 686 days.

(21) Appl. No.: 14/419,212

(22) PCT Filed: Jul. 26, 2013

(86) PCT No.: PCT/EP2013/065824
§ 371 (c)(1),
(2) Date: Feb. 2, 2015

(87) PCT Pub. No.: WO2014/023589
PCT Pub. Date: Feb. 13, 2014

(65) Prior Publication Data
US 2015/0205197 A1    Jul. 23, 2015

Related U.S. Application Data

(60) Provisional application No. 61/680,042, filed on Aug. 6, 2012.

(51) Int. Cl.
*G06F 17/50*       (2006.01)
*G03F 7/00*        (2006.01)

(52) U.S. Cl.
CPC ........ *G03F 7/0002* (2013.01); *G06F 17/5009* (2013.01); *G06F 17/5068* (2013.01)

(58) Field of Classification Search
CPC ............. G03F 7/70433; G06F 17/5009; G06F 17/5068
USPC ........................................................ 716/110
See application file for complete search history.

(56) References Cited

U.S. PATENT DOCUMENTS

| 7,386,162 | B1 | 6/2008 | Dakshina-Murthy et al. |
| 8,114,306 | B2 | 2/2012 | Cheng et al. |
| 8,309,278 | B2 | 11/2012 | Yang et al. |
| 9,367,910 | B2 * | 6/2016 | Van Heesch ........ G06F 17/5045 |
| 2009/0196488 | A1 | 8/2009 | Nealey et al. |
| 2011/0194751 | A1 | 8/2011 | Takimoto et al. |
| 2011/0209106 | A1 | 8/2011 | Cheng et al. |
| 2014/0363072 | A1 * | 12/2014 | Van Heesch ........ G06F 17/5045 382/141 |

FOREIGN PATENT DOCUMENTS

| WO | 2004/114016 | 12/2004 |
| WO | 2012/031818 | 3/2012 |
| WO | 2012/084558 | 6/2012 |

OTHER PUBLICATIONS

International Search Report dated Nov. 11, 2013 in corresponding International Patent Application No. PCT/EP2013/065824.
Li-Tang Yan et al,, "Computational modeling and simulation of nanoparticle self-assembly in polymeric systems: Structures, properties and external field effects," Progress in Polymer Science, vol. 38, pp. 369-405 (2013).
Miri Park et al., "Block Copolymer Lithography: Periodic Arrays of ~$10^{11}$ Holes in 1 Square Centimeter," Science, vol. 276, pp. 1401-1404 (May 30, 1997).
Robert D. Groot et al., "Dissipative particle dynamics: Bridging the gap between atomistic and mesoscopic simulation," J. Chem. Phys., vol. 107, No. 11, pp. 4423-4435 (Sep. 15, 1997).
S.R. Ren et al., "Cell Dynamics Simulations of Microphase Separation in Block Copolymers," Macromolecules, vol. 34, pp. 116-126 (2001).
J.G.E.M. Fraaije et al., "The dynamic mean-field density functional method and its application to the mesoscopic dynamics of quenched block copolymer melts," J. Chem. Phys., vol. 106, No. 10, pp. 4260-4269 (Mar. 8, 1997).
O.N. Vassiliev et al., "Fluctuation effects in block copolymer melts," J. Chem. Phys., vol. 118, No. 16, pp. 7700-7713 (Apr. 22, 2003).

(Continued)

*Primary Examiner* — Daborah Chacko-Davis
(74) *Attorney, Agent, or Firm* — Pillsbury Winthrop Shaw Pittman LLP

(57) ABSTRACT

A method of designing an epitaxy template to direct self-assembly of a block copolymer on a substrate into an ordered target pattern involves providing a primary epitaxy template design and then varying the design to optimize a pattern fidelity statistic, such as placement error, relative to the target pattern by modelling predicted self-assembled block copolymer patterns and optimizing pattern placement as a function of a varied design parameter. In addition to varying a design parameter to optimize the pattern fidelity statistic, a random error in the template design is included prior to modelling predicted patterns in order to compensate for expected template inaccuracy in practice. The inclusion of a realistic random error in the template design, in addition to systematic variation of a design parameter, may improve the template design optimization to render the result less sensitive to error which may be inevitable in practice.

20 Claims, 7 Drawing Sheets

(56) References Cited

OTHER PUBLICATIONS

K. Binder et al., "Monte Carlo simulation of block copolymers," Current Opinion in Colloid & Interface Science, vol. 5, pp. 315-323 (2000).

* cited by examiner

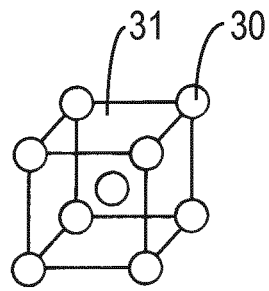 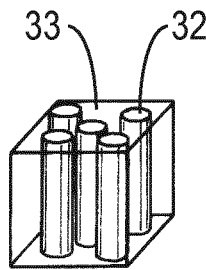 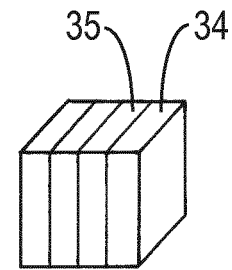
*Fig. 3A*  *Fig. 3B*  *Fig. 3C*
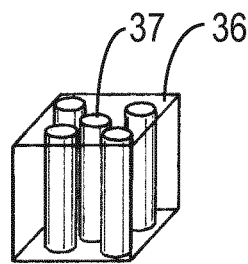 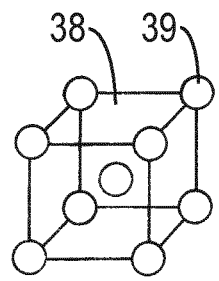
*Fig. 3D*  *Fig. 3E*
*Fig. 4A*
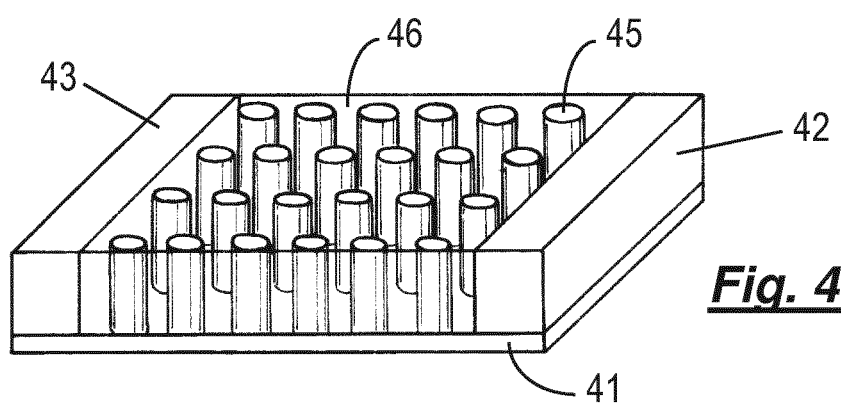
*Fig. 4B*

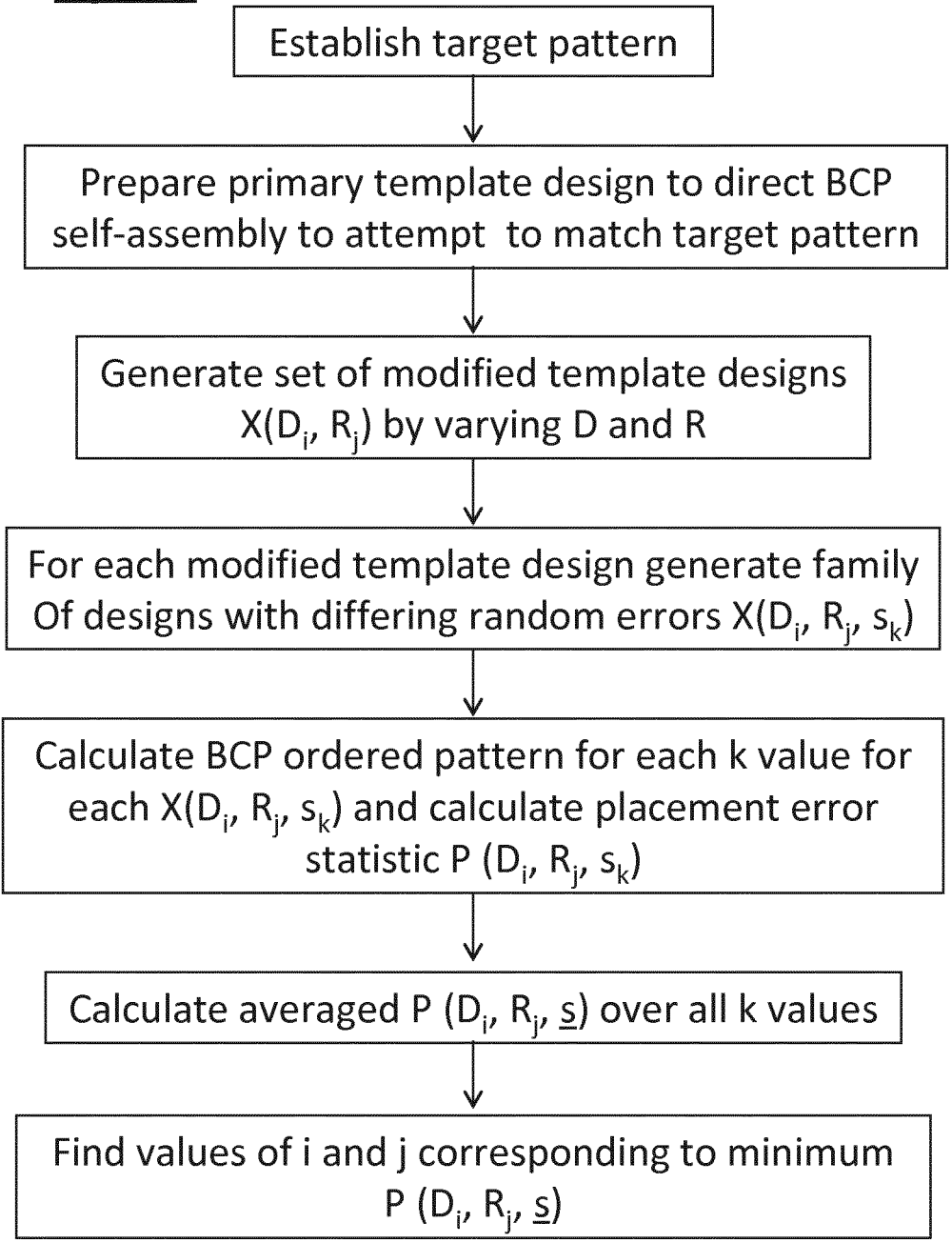

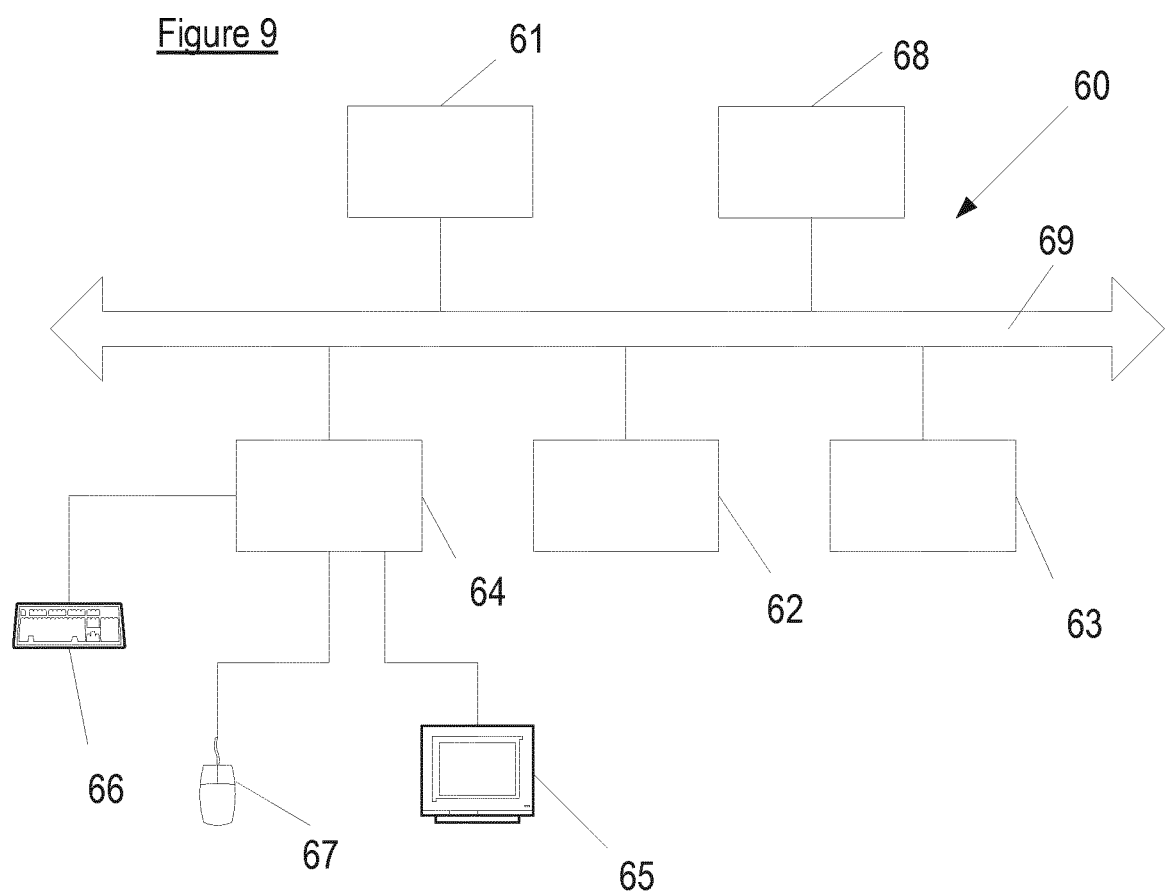

METHODS FOR PROVIDING LITHOGRAPHY FEATURES ON A SUBSTRATE BY SELF-ASSEMBLY OF BLOCK COPOLYMERS

CROSS-REFERENCE TO RELATED APPLICATIONS

This application is the U.S. national phase entry of PCT patent application no. PCT/EP2013/065824, which was filed on Jul. 26, 2013, which claims the benefit of priority of U.S. provisional application No. 61/680,042, which was filed on Aug. 6, 2012, the contents of which is incorporated herein in its entirety by reference.

FIELD

The present invention relates to a method of forming a lithography feature on a substrate.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces, for example of an imprint template or of other substrates, and chemical resists may be used to achieve this.

The use of self-assembly of a block copolymer (BCP) has been considered as a potential method for improving the resolution to a better value than obtainable by prior art lithography methods or as an alternative to electron beam lithography for preparation of imprint templates.

A self-assemblable block copolymer is a compound useful in nanofabrication because it may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometres or even less than 10 nm. The size and shape of the domains may be controlled by manipulating the molecular weight and composition of the different block types of the copolymer. The interfaces between the domains may have a line width roughness of the order of about 1-5 nm and may be manipulated by modification of the chemical compositions of the blocks of the copolymers.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each typically comprising one or more identical monomers, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer such as (A-B-C) block copolymer may be useful, as may an alternating or periodic block copolymer e.g. $[-A-B-A-B-A-B-]_n$ or $[-A-B-C-A-B-C]_m$ where n and m are integers. The blocks may be connected to each other by covalent links in a linear or branched fashion (e.g., a star or branched configuration).

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the phases formed. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative molecular volume fractions of the different polymer blocks. For instance, a molecular volume ratio of 80:20 will provide a cubic phase of discontinuous spherical domains of the low volume block arranged in a continuous domain of the higher volume block. As the volume ratio reduces to 70:30, a cylindrical phase will be formed with the discontinuous domains being cylinders of the lower volume block. At a 50:50 ratio, a lamellar phase is formed. With a ratio of 30:70 an inverted cylindrical phase may be formed and at a ratio of 20:80, an inverted cubic phase may be formed.

Suitable block copolymers for use as a self-assemblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes substantially parallel or substantially perpendicular to the substrate and lamellar and cylindrical phases are interesting for lithography applications, as they may provide a resist to form line and space patterns and hole arrays, respectively, when oriented with their domains lying side-by-side on a substrate, and may provide good contrast when one of the domain types is subsequently etched.

It will be understood a block copolymer composition comprising two or more differing block copolymer molecule types may be used for self-assembly.

Two methods used to guide or direct self-assembly of a polymer, such as a block copolymer, onto a surface are graphoepitaxy and chemical pre-patterning, also called chemical epitaxy. In the graphoepitaxy method, self-organization of block copolymer is guided by topological pre-patterning on the substrate. Lamellar self-assembled block copolymer can form substantially parallel linear patterns with adjacent lines of the different polymer block domains in the enclosures or trenches defined by one or more side walls of the graphoepitaxy template. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the graphoepitaxy template by a side wall being spaced to fit several domains of the block copolymer side-by-side. For hexagonal or tetragonal (cylindrical) ordered patterns, the graphoepitaxy features may be pillars standing in place of cylindrical domains of the ordered pattern of the block copolymer.

In the chemical pre-patterning method (referred to herein as chemical epitaxy), the self-assembly of block copolymer domains is guided by a chemical pattern (i.e. a chemical epitaxy template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical epitaxy pattern may comprise a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of the pre-patterned features on the substrate (so-called density or pitch multiplication). As was the case with graphoepitaxy, chemical pre-patterning is not limited to a linear pre-pattern; for instance the chemical epitaxy template may be in the form of a 2-D array of dots suitable as a pattern for use with a cylindrical (e.g. hexagonal or square pattern) phase-forming block copolymer. Graphoepitaxy and chemical pre-patterning may be used, for instance, to guide the self-organization of lamellar or cylindrical phases, so that the different domain types are arranged side-by-side on a surface of a substrate.

Typically, the height of features of a graphoepitaxy template may be of the order of the thickness of the block copolymer layer to be ordered, so may be, for instance, from about 20 nm to about 150 nm whereas for a chemical epitaxy template, the height difference between adjacent regions of a chemical epitaxy template will typically be less than about 15 nm, say less than about 10 nm or even less than about 5 nm in order to reduce or minimize likelihood of defect formation.

SUMMARY

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented substantially parallel to the plane of the surface.

Substantially perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between adjacent domains of different blocks lying substantially perpendicular to the plane of the surface.

A neutral surface for use in chemical epitaxy and graphoepitaxy is particularly useful. It may be used on surfaces between specific orientation regions of an epitaxy template. For instance in a chemical epitaxy template to align a di-block copolymer having A and B blocks, where A is hydrophilic and B is hydrophobic in nature, the chemical pattern may comprise hydrophobic pinning sites with a neutral orientation region between the hydrophobic sites. The B domain may preferentially assemble onto the hydrophobic pinning sites, with several alternating domains of A and B blocks aligned over the neutral region between the specific (pinning) orientation regions of the chemical epitaxy template.

For instance in a graphoepitaxy template to align such a di-block copolymer the pattern may comprise hydrophobic resist features as pillars or side-walls with a neutral orientation region between the hydrophobic resist features. The B domain may preferentially assemble alongside the hydrophobic resist features, with several alternating domains of A and B blocks aligned over the neutral orientation region between the pinning resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to about 40 nm, or less than or equal to about 20 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable block copolymer may be deposited onto a substrate having a graphoepitaxy or chemical epitaxy template as set out above. A suitable method for deposition of the self-assemblable polymer is spin-coating, as this process is capable of providing a well-defined, uniform, thin layer of self-assemblable polymer. A suitable layer thickness for a deposited self-assemblable polymer film is approximately 10 nm to 100 nm. Following deposition of the block copolymer film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a block copolymer is a process where the assembly of many small components (the block copolymer) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few ° C. above or below the order/disorder temperature $T_{OD}$ for the polymer.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern may be transferred by so-called transfer etching using an etching means which is resisted by the second domain type and so forms recesses in the substrate surface where the surface has been laid bare.

In a self-assembled block copolymer system, defects may be present for various reasons. If ordering of the domains forming the self-assembled array from the block copolymer initiates from one or more different nucleation sites on a surface of a substrate, mismatches in structure of the resulting final assembly may result. Typical examples of defects include a discontinuity in an assembled pattern, a dislocation and/or a missing unit in a pseudo-crystalline arrangement (for example, a missing cylinder in a hexagonal phase pattern). In addition to such a defect, a placement error arising from deviation from a perfect grid of highly repetitive features may be an obstacle hampering the use of self-assembled block copolymer, especially for circumstances where an ordered phase such as cylindrical phase or cubic phase or tetragonal phase is used to provide a 2-D array of resist features, for instance of use for the provision of contacts on a substrate.

For a self-assembled block copolymer providing a two-dimensional (2-D) ordered pattern on a substrate, there will typically be parallel rows of discontinuous first domains extending parallel to a Cartesian y axis separated from each other by a continuous second domain. Typically there will be no periodicity normal to the surface of the substrate (i.e. along the Cartesian z axis). Orientation of parallel rows in a trench formed between graphoepitaxial side walls, defining the Cartesian y axis, on a substrate may be well controlled. However, placement of the discontinuous domains along the y axis may not be well controlled. For a cylindrical self-assembled phase, the discontinuous first domains will be the cylinders and adjacent rows parallel to the y axis will have the cylinders offset relative to each other so that parallel rows of cylinders will lie at 60° to the rows of cylinders aligned parallel to the y axis.

For many applications, such as nanofabrication of integrated circuits (ICs) and hard drives, the placement error of such discontinuous domains should be small (say 3 nm or less). The placement error can be quantified by determining the deviation of the actual discontinuous domains from the corresponding perfect grid-points of a hypothetical perfectly self-assembled 2-D array (i.e. a target pattern) and calculating a placement error statistic. One or more other pattern fidelity statistics may be used, instead of or in addition to pattern placement error, to quantify placement precision for the ordered pattern (such as critical dimension uniformity)

It is desirable, for example, to provide a method which may precisely control the placement of the discontinuous first domains of a self-assembled block copolymer so that the resulting ordered pattern closely matches the desired target pattern. It is desirable, for example, to provide a method which results in only small variation in pitch, in other words helping to ensure that the discontinuous first domains are precisely evenly spaced relative to each other throughout an ordered pattern.

It is desirable, for example, to have a method of forming accurately placed lithography features on a substrate, by use of self-assembly of block copolymers on the substrate, to provide an ordered block copolymer pattern which corresponds accurately to a desired or target pattern, with the ordered block copolymer pattern used as a resist for etching of the lithography features into the substrate.

It is desirable, for example, that the pattern features should be of small size (width or diameter of say about 20 nm or less) and that the spacing between adjacent features should be as small as possible—say having a periodic spacing of about 50 nm or less.

It is desirable, for example, that the placement accuracy of pattern features relative to the target pattern should be relatively insensitive to a defect, such as a stochastic defect, in an epitaxy template used to direct self-assembly of the block copolymer.

It is desirable, for example, to provide a method of providing accurate placement of such lithography features on substrate surface by means of use of an epitaxy template designed to minimize risk of placement error.

Thus, an embodiment of the invention relates to a method of forming a lithography feature on a substrate, by use of self-assembly of a block copolymer directed by an epitaxy feature on the substrate. The method may be useful for improving critical dimension and placement accuracy for the lithography feature.

There is provided, for example, a method of designing an epitaxy template on a substrate surface, for use in guiding a self-assembled layer of block copolymer which is arranged to self-assemble into a 2-D array on the substrate surface for use as, for example, a resist layer suitable for use in device lithography. Such a method may overcome or address one or more of the problems in the art. For example, there is provided an epitaxy template design method which enables an epitaxy template to be formed to direct accurate placement of such a 2-D array relative to the substrate to match a desired target pattern.

There is provided, for example, a method of optimizing design of an epitaxy template, to be formed using photolithography, for instance with actinic radiation such as UV DUV or EUV radiation, to direct self-assembly of the block copolymer with low levels of placement error relative to a target pattern.

In an aspect, there is provided a method of designing an epitaxy template to direct self-assembly of a block copolymer into a target pattern on a substrate, the method comprising providing a primary epitaxy template design, and modifying the primary epitaxy template design to generate a final epitaxy template design, wherein self-assembly of the block copolymer directed by the final epitaxy template design provides an ordered pattern of self-assembled block copolymer, with an improved pattern fidelity statistic, relative to the target pattern, compared to the pattern fidelity statistic obtained when self-assembly is directed by the primary epitaxy template design, wherein the final epitaxy template design is derived by:

modelling predicted ordered patterns of self-assembled block copolymer directed by modified epitaxy template designs generated from the primary epitaxy template design by systematically varying a design parameter in the modified epitaxy template designs, and optimizing the pattern fidelity statistic for the predicted ordered patterns of self-assembled block copolymer, relative to the target pattern, as a function of the varied design parameter for the modified epitaxy template designs, and wherein a random error is included in at least one of the epitaxy template designs prior to modelling predicted ordered patterns of self-assembled block copolymer.

In an aspect, there is provided a computer program comprising computer readable instructions configured to cause a computer to carry out a method as described herein.

In an aspect, there is provided a computer readable medium carrying the computer program described herein.

In an aspect, there is provided a computer apparatus to carry out a method described herein, the computer apparatus comprising:

a memory storing processor readable instructions, and a processor arranged to read and execute instructions stored in the memory, wherein the processor readable instructions comprise instructions arranged to control the computer to carry out a method described herein.

In an aspect, there is provided a lithographic projection apparatus arranged to project a pattern from a patterning device onto a substrate, wherein the lithographic projection apparatus comprises a computer apparatus as described herein.

The following features are applicable to all the various aspects of the invention where appropriate. When suitable, combinations of the following features may be employed as part of the embodiments of the invention, for instance as set out in the claims. An embodiment of the invention is particularly suitable for use in device lithography. For instance, an embodiment of the invention may be of use in patterning a device substrate directly or may be of use in patterning an imprint template for use in imprint lithography.

The self-assemblable block copolymer composition may be a block copolymer composition as set out hereinbefore comprising at least two different block types, referred to as first and second polymer blocks, which are self-assemblable into an ordered polymer layer having the different block types associated into first and second domain types. The block copolymer composition may comprise a di-block copolymer and/or tri-block or multi-block copolymers. An alternating or periodic block copolymer may also be used as the self-assemblable polymer. Although only two domain types may be mentioned in some of the following aspects and examples, an embodiment of the invention is also applicable to a self-assemblable polymer with three or more different domain types. The self-assemblable block copolymer is desirably a di-block copolymer.

By "chemical affinity", in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. Chemical affinity may also be expressed in terms of "wetting", where a liquid will wet a solid surface if the liquid and surface have a high chemical affinity for each other, whereas the liquid will not wet the surface if there is a low chemical affinity. Chemical affinities of surfaces may be measured, for instance, by means of contact angle measurements using various liquids, so that if one surface has the same contact angle for a liquid as another surface, the two surfaces may be said to have substantially the same chemical affinity for the liquid. If the contact angles differ for the two surfaces, the surface with the smaller contact angle has a higher chemical affinity for the liquid than the surface with the larger contact angle.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components. The terms "consist of" or "consisting of" mean including the components specified but excluding the deliberate addition of other components.

Whenever appropriate, the use of the term "comprises" or "comprising" may also be taken to include the meaning "consist of" or "consisting of", "consists essentially of" or "consisting essentially of".

In this specification, when reference is made to the thickness of a feature, the thickness is suitably measured by an appropriate means along an axis substantially normal to the substrate surface and passing through the centroid of the feature. Thickness may suitably be measured by a technique such as interferometry or assessed through knowledge of etch rate.

Wherever mention is made of a "layer" in this specification, the layer referred to is to be taken to be layer of substantially uniform thickness, where present. By "substantially uniform thickness" is meant that the thickness does not vary by more than 10%, desirably not more than 5% of its average value across the layer.

As discussed herein, there is provided a method of designing an epitaxy template to direct self-assembly of a block copolymer into a target pattern on a substrate. The method comprises providing a primary epitaxy template design, and modifying the primary epitaxy template design to generate a final epitaxy template design. The primary epitaxy template design may be a design aimed at directing the self-assembly of a particular block copolymer to form an ordered pattern on a substrate, with the ordered pattern corresponding, as closely as possible, to a target pattern. The closeness of match between the resulting ordered pattern and the desired target pattern may be assessed by a pattern fidelity statistic. The pattern fidelity statistic provides a measure of how closely the resulting ordered pattern matches the desired target pattern.

The primary epitaxy template design may only be an approximate design, based upon simple correlations between the domain dimensions of the block copolymer, the self-assembly of which is to be directed, and the dimensions of the desired target pattern. As a result of this, when detailed modelling of the ordered pattern resulting from self-assembly of the block copolymer as directed by the primary epitaxy template design is carried out, the resulting predicted pattern may be a poor match to the desired target pattern. The final epitaxy template design, modified from the primary design using the method herein, provides an ordered pattern of self-assembled block copolymer with an improved pattern fidelity statistic, relative to the target pattern, compared to the pattern fidelity statistic obtained when self-assembly is directed by the primary epitaxy template design.

The final epitaxy template design is derived by modelling predicted ordered patterns of self-assembled block copolymer directed by modified epitaxy template designs generated from the primary epitaxy template design by systematically varying one or more design parameters in the modified epitaxy template designs, and optimizing the pattern fidelity statistic for the predicted ordered patterns of self-assembled block copolymer, relative to the target pattern, as a function of the one or more varied design parameters for the modified epitaxy template designs.

In this way, the manner in which the pattern fidelity statistic varies as a function of the design parameter may be derived, for instance as a functional relationship between the varied design parameter and the pattern fidelity statistic. This functional relationship may then be used to provide an optimized set of the varied design parameters to give an optimized pattern fidelity statistic corresponding, for instance, to a resulting ordered pattern that closely matches the target pattern.

In the method, a random error is included in the epitaxy template designs prior to modelling predicted ordered patterns of self-assembled block copolymer. The random error is included in order to simulate random error which may be expected to occur in practical implementation of the formation and use of an epitaxy template for direction of self-assembly of a block copolymer. The random error may be included in the primary epitaxy design template in addition to in one or more of the modified epitaxy design templates.

For instance, for each of one or more epitaxy template designs, a family of versions of that epitaxy template design may be generated, each member of that family having that epitaxy template design but with a random error different from a random error of each other family member, wherein a pattern fidelity statistic, for the predicted ordered patterns of self-assembled block copolymer relative to the target pattern, is calculated for each family member.

The pattern fidelity statistic for each epitaxy template design may be calculated by averaging a respective pattern fidelity statistic for each family member of the family of versions for that epitaxy template design.

The pattern fidelity statistic may be a placement error statistic and/or a critical dimension uniformity statistic. For instance, the placement error statistic may be a mean placement error.

The systematically varied design parameter may be selected from the group consisting of: lithography resolution used to form the epitaxy template design, a dimension of the design, a shape of a pattern placement feature, a frequency of pattern placement features, an angle between edges of the design, and any combination selected therefrom.

The primary epitaxy template design may be based upon a theoretical design having sharp corners, which in practice will have its corners rounded or blurred as a result of resolution limitation in practice. The effect of resolution used for lithography of the template may be used as a variable for optimization of the pattern fidelity statistic.

The template may rely on a trench of defined width between walls of the template in order to direct self-assembly between the walls. The width of such a trench may be used as a variable for optimization of the pattern fidelity statistic.

The template may include a pattern placement feature such as one or more recesses or buttresses along one or more trench side walls, used to control placement of the self-assembled pattern along the length of a trench. The effect of the variation in shape, size or frequency of placement of such feature may be used as a variable for optimization of the pattern fidelity statistic.

The template may include an angle between edges of its structure, used to control placement of the self-assembled pattern by the template. The effect of the variation in the size of such angle may be used as a variable for optimization of the pattern fidelity statistic.

The random error (also referred to in the art as a stochastic feature) may be any suitable error which is likely to arise in a random manner during a practical lithography method. The random error may be typically selected from the group consisting of: line edge roughness, line edge width variability, resist layer thickness variability, resolution variability, block copolymer layer thickness variability, and any combination selected therefrom.

It will be understood that for an epitaxy template formed by a photolithographic method, at or near the limits of resolution of the photolithographic method to be used, there will be random variation in a line edge (width and/or roughness) and/or in resist thickness both prior to, and/or following, etching. Also, when self-assembly of a block copolymer layer is directed by such a template, it will be appreciated that there may be random thickness variation for the polymer layer deposited over the epitaxy template.

The predicted ordered patterns of self-assembled block copolymer directed by the modified epitaxy template designs may be modelled by any suitable mathematical modelling method. For instance, the modelling method may be selected from the group consisting of: dynamic density functional theory (e.g. J. G. E. M. Fraaije, B. A. C. van Vlimmeren, N. M. Maurits, M. Postma, O. A. Evers, C. Hoffmann, P. Altevogt, and G. Goldbeck-Wood, J. Chem. Phys. 106, 4260-1997), dissipative particle dynamics (e.g. Robert D. Groot and Patrick B. Warren, J. Chem. Phys. 107, 4423-1997), Brownian dynamics (e.g. O. N. Vassiliev and M. W. Matsen, J. Chem. Phys. 118, 7700-2003), Monte Carlo simulation (K. Binder, M. Wüller, Current Opinion in Colloid & Interface Science 5 315-323-2000), cell dynamics (S. R. Ren and I. W. Hamley, Macromolecules, 34, 116-2001), and self-consistent field theory (e.g. G. H. Frederickson, The Equilibrium Theory of Inhomogeneous Polymers, ISBN 0198567294, 9780198567295, Clarendon Press, 2006). Combinations of such techniques may be used. The methods are thought to be equivalent in their equilibrium predictions, though the dynamics included in the models may not necessarily match physical reality.

The epitaxy template design may be a design for a graphoepitaxy template or for a chemical epitaxy template.

The method may suitably be implemented in a computer comprising a processor communicating with a memory.

The method of the invention may further comprise:
providing a final epitaxy template according to the final epitaxy design on a substrate,
using the final epitaxy template to direct self-assembly of a block copolymer into an ordered pattern onto the substrate, and
using the ordered pattern as a resist for lithography of the substrate.

The ordered layer of self-assembled block copolymer composition may be used as a resist layer, to etch a lithography feature into the substrate, by selective removal of first domain of the block copolymer ordered pattern followed by subsequent etching of the underlying substrate with the remaining second domain of the block copolymer pattern used as an etch mask.

In a suitable arrangement, the lithography features may be contact pads of a highly conductive material such as metal, deposited into holes formed following removal of the first domain. In order to transfer a pattern from the ordered self-assembled polymer layer into the substrate, typically the first domain may be removed by so-called breakthrough etching to provide a pattern of the second domain on the surface of the substrate with the substrate laid bare where the first domain has been removed.

Following the breakthrough etching, the pattern may be transferred by so-called transfer etching using an etchant which is resisted by the second domain and so forms a recess in the substrate surface where the surface has been laid bare. The substrate surface may typically have been initially covered by a dielectric layer, under the block copolymer layer, with holes etched through the dielectric layer, during this transfer etching stage, to the underlying substrate. The holes may then be filled with metal to provide contact electrodes.

In an aspect, there is provided a computer program comprising computer readable instructions configured to cause a computer to carry out the method described herein, as well as a computer readable medium carrying such a computer program.

In an aspect, there is provided a computer apparatus to carry out a method described herein, the computer apparatus comprising: a memory storing processor readable instructions, and a processor arranged to read and execute instructions stored in the memory, wherein the processor readable instructions comprise instructions arranged to control the computer to carry out the method.

In an aspect, there is provided a lithographic projection apparatus arranged to project a pattern from a patterning device onto a substrate, wherein the lithographic projection apparatus comprises a computer apparatus as described herein.

Deposition of a final epitaxy template according to the final epitaxy template design may be by photolithographic etching of a resist layer on a substrate. A resist layer may be provided on the substrate by any suitable method, such as spin coating of a resist solution in a solvent followed by evaporative drying to provide the resist layer on the substrate. The final epitaxy template may be formed from the resist layer by removal of a selected portion of the resist layer. This is typically achievable by selective exposure of the resist to actinic radiation, such as UV radiation, followed by removal of the exposed (positive tone resist) or unexposed (negative tone resist) regions. The actinic radiation may be UV radiation such as DUV (deep UV) or EUV (extreme UV). The selective exposure to actinic radiation may be by patterning of the UV radiation with a lithography apparatus. A conventional lithographic patterning method such as mask or maskless UV lithography may be used to provide a desired high resolution exposure pattern on the resist layer to give the exposed and unexposed regions. Typical DUV lithography is carried out using UV radiation having a wavelength of about 193 nm.

The substrate may typically be a semiconductor substrate, and may comprise a plurality of layers forming the substrate. For instance, the outermost layer of the substrate upon which the resist layer is provided, may be an ARC (anti-reflection coating) layer. Suitably, the outermost layer of the substrate may be neutral to the domains of the block copolymer, by which it is meant that it has a similar chemical affinity for each of the domain types of the block copolymer. Alternatively, a neutral orientation layer may be provided as an uppermost or outermost surface layer of the substrate, as described herein.

A method described herein may suitably involve the self-assemblable block copolymer being adapted to form an ordered layer having first, discontinuous domains of first block of the block copolymer, in a hexagonal or square array, alternating with a second continuous domain of second block of the block copolymer therebetween.

BRIEF DESCRIPTION OF THE DRAWINGS

Specific embodiments of the invention will be described with reference to the accompanying figures, in which:

FIGS. 3A to 3E schematically depict the different phases formed by a poly(styrene-b-methylmethacrylate) polymer as the relative volume fractions of the polystyrene and PMMA blocks are varied relative to each other;

FIGS. 4A and 4B schematically depict a block copolymer forming a cylindrical phase as a 2-D array between side walls of a graphoepitaxy template;

FIG. 8 shows a schematic flow diagram for a method according to an embodiment of the invention; and FIG. 9 shows a schematic diagram of a computer assembly suitable for use with an embodiment of the invention.

DETAILED DESCRIPTION

The described and illustrated embodiments are to be considered as illustrative and not restrictive in character, it being understood that only preferred embodiments have been shown and/or described and that all changes and modifications that come within the scope of the inventions as defined in the claims are desired to be protected.

Figure 1A:
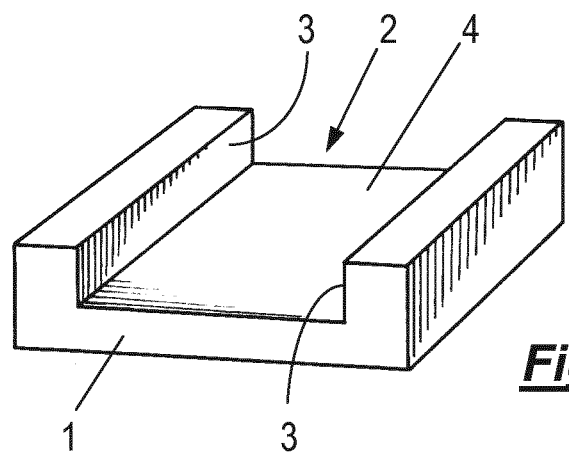
FIGS. 1A to 1C schematically depict directed self-assembly of A-B block copolymer onto a substrate by graphoepitaxy and formation of relief patterns by selective etching of one domain.
Figure 1B:
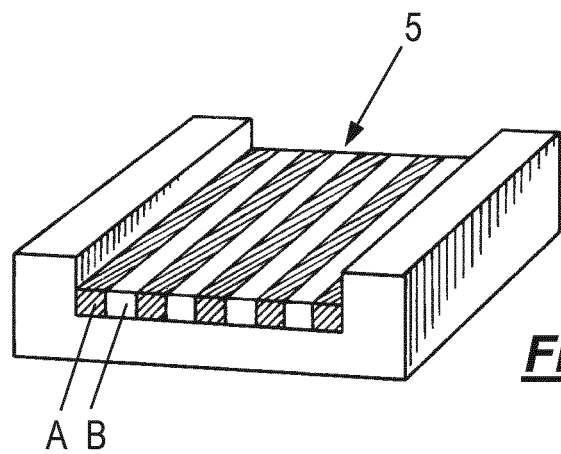
Figure 1C:
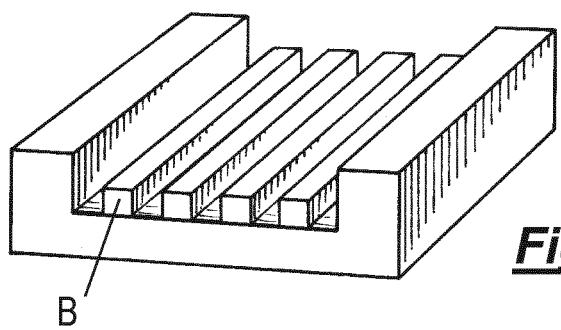

FIG. 1A shows a substrate 1 with a trench 2 formed therein bounded by side walls 3 and a bottom surface 4. In FIG. 1B, a self-assemblable A-B block copolymer with, e.g., hydrophilic A blocks and, e.g., hydrophobic B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to a side wall 3, which is also, e.g., hydrophilic. In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each side wall.

Figure 2A:
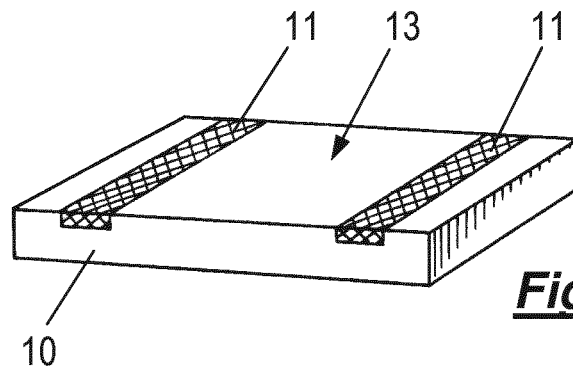
FIGS. 2A to 2C schematically depict directed self-assembly of A-B block copolymer onto a substrate by chemical epitaxy and formation of relief patterns by selective etching of one domain.
Figure 2B:
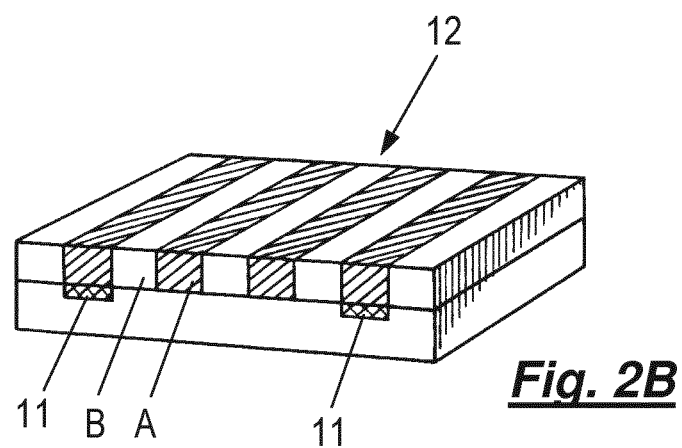
Figure 2C:
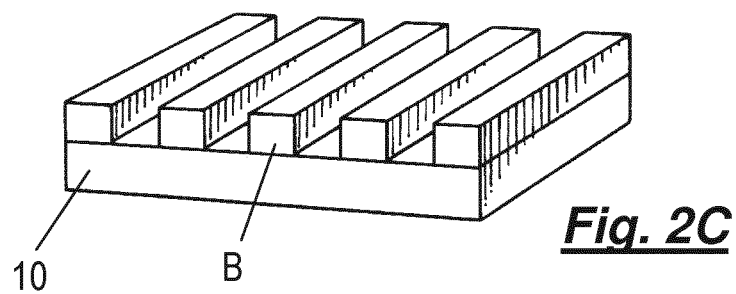

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with, e.g., hydrophilic A blocks and, e.g., hydrophobic B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning or chemical epitaxy. The type A domains have nucleated atop the pinning or nucleation stripes 11, which are also, e.g., hydrophilic. In FIG. 2C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

FIGS. 3A to 3E show the progression of different phases formed by self-assembled poly(styrene-b-methylmethacrylate) block copolymer in a thin film on a surface. In FIG. 3A, a cubic phase is shown with the discontinuous domains being spheres of PMMA within a continuous domain of PS for a ratio PS:PMMA of 80:20. As the ratio PS:PMMA reduces to 70:30, a cylindrical phase formed with the discontinuous domains being cylinders of PMMA. At 50:50 ratio, a lamellar phase is formed as shown in FIG. 3C. With a ratio of 30:70 PS:PMMA, an inverted cylindrical phase is formed, shown in FIG. 3D, with the discontinuous domains being of PS and at a ratio of 20:80, shown in FIG. 3E, an inverted cubic phase is formed.

In the following description of FIG. 3, the di-block copolymer used as self-assemblable polymer is poly(styrene-b-methylmethacrylate) block copolymer, denoted by the acronym PS/PMMA, arranged for self-assembly as explained herein. However, the method is also applicable to other self-assemblable block copolymers comprising different monomer types.

In FIG. 3, FIGS. 3A to 3B show the progression of different phases formed by self-assembled poly(styrene-b-methylmethacrylate) block copolymer in a thin film on a surface. In FIG. 3A, a cubic phase is shown with the discontinuous domains 30 being spheres of PMMA within a continuous domain 30 of PS for a ratio PS:PMMA of 80:20.

As the ratio of PS:PMMA reduces to 70:30, a cylindrical phase formed with the discontinuous domains 32 being cylinders of PMMA as shown in FIG. 3B in a continuous domain 33. At 50:50 ratio, a lamellar phase 34, 35 is formed as shown in FIG. 3C. With a ratio of 30:70 PS:PMMA, an inverted cylindrical phase is formed, shown in FIG. 3D, with the discontinuous domains 37 being of PS in a continuous domain 36 and at a ratio of 20:80, shown in FIG. 3E, inverted cubic phase is formed with the discontinuous domains 39 being spheres of PS within a continuous domain 38 of PMMA.

Turning to FIG. 4A, this depicts poly(styrene-b-methylmethacrylate) block copolymer with a volume fraction ratio 70:30 for PS:PMMA. The polymer section 46 represents polystyrene with polymer section 45 representing PMMA. In FIG. 4B, this polymer is shown self-assembled into a 2-D array between side walls 42, 43 of a graphoepitaxy template on a substrate 41, with the PMMA 45 forming the discontinuous cylindrical domains and the polystyrene 46 forming the continuous domain surrounding the cylinders. The sidewalls of the graphoepitaxy template in this case have a high chemical affinity for the PMMA 45 which leads to this arrangement where the PMMA cylinders 45 are in rows spaced apart from the sidewalls by regions of second continuous phase of polystyrene 46.

In the following examples, set out with reference to the FIGS. 5 to 7, the di-block copolymer used as self-assemblable block polymer is a poly(styrene-b-methylmethacrylate) block copolymer, denoted by the acronym PS/PMMA, arranged for self-assembly into a 2-D hexagonal cylindrical array, as explained hereinbefore. However, the method is also applicable to other self-assemblable block copolymers comprising different monomer types.

Figure 5:
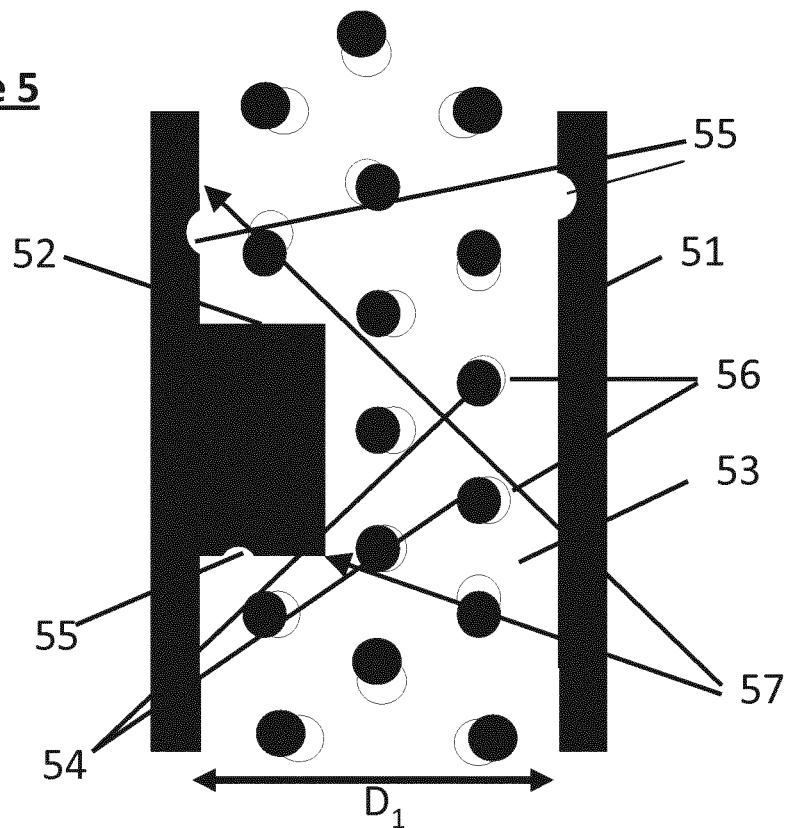
FIG. 5 shows a primary epitaxy template design with a target pattern and predicted pattern for a self-assembled block copolymer.

FIG. 5 shows a primary epitaxy template design 51 with a target pattern shown by the placement of first domains 54 shown as solid circles, and a predicted pattern shown by open circles 56 indicating the expected placement of first domains as directed by the primary epitaxy template design 51 for a self-assembled block copolymer. The primary epitaxy template design has 2 sidewalls enclosing a trench 53 and a rectangular buttress 52 as a pattern placement feature. The pattern placement feature 52 has sharp corners and edges. Random defects in edges of the primary epitaxy template design have been included as recesses 55. For the primary epitaxy template design 51 as shown in FIG. 5, the width of the trench 53 between the sidewalls is a value of D1.

Figure 6:
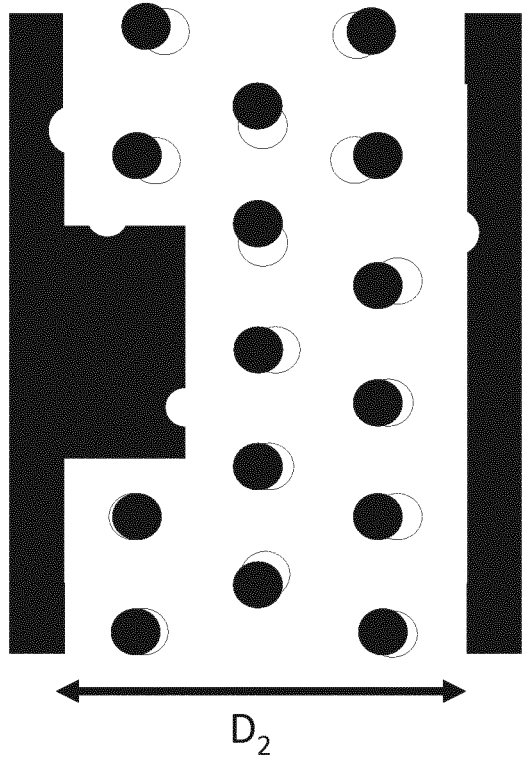
FIG. 6 shows a modified epitaxy template design with side wall spacing used as variable.

FIG. 6 shows a modified epitaxy template design which is almost identical to the primary epitaxy template design 51 shown in FIG. 5, but with the width of trench (denoted by D) between the sidewalls increased from D1 to a value D2, and with different random defects 55 in the sidewalls of the modified epitaxy template design.

In order to carry out the method, the mean placement error (used as the pattern fidelity statistic in this embodiment) may be calculated for the predicted pattern 56 relative to the target pattern 54 for the primary epitaxy template design 51. This may then be repeated for a family of primary epitaxy template designs, each with a different random error (e.g., different random defects 55). The resulting family of mean placement errors may be then be averaged to give an overall mean placement error for patterns directed by the primary epitaxy template design 51.

This procedure may then be repeated for each value of trench width D between the sidewalls, over a range of values of trench width different from D1, in order to establish a relationship between the trench width and the overall mean placement error. This function may then be used in order to optimize the overall mean placement error selection of a final epitaxy template design having a trench width which provides the lowest available overall mean placement error according to the function established.

Figure 7:
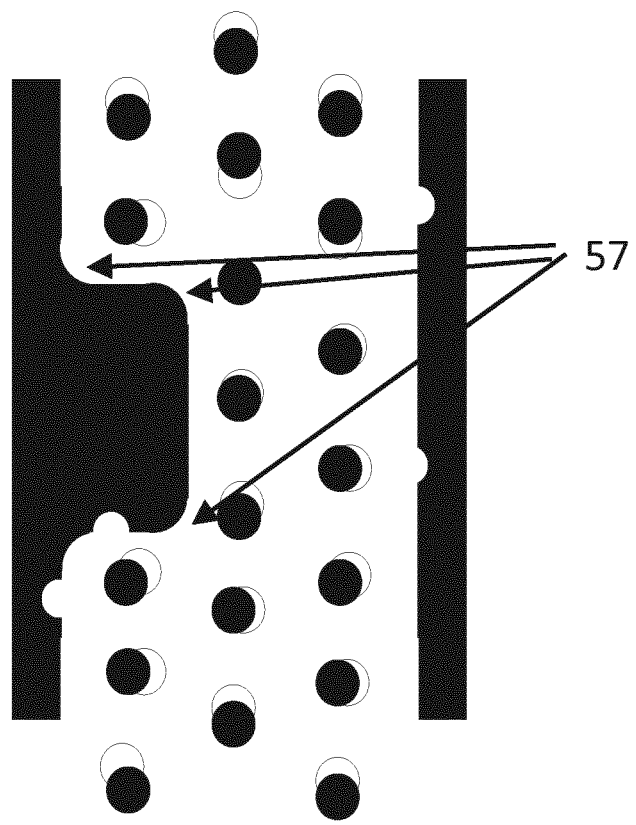
FIG. 7 shows a modified epitaxy template design with corner radius used as variable.

FIG. 7 shows a modified epitaxy template design which is almost identical to the primary epitaxy template design 51 shown in FIG. 5, but for this modified epitaxy template design, the sharp edges and corners of the pattern placement feature 52 have been rounded to form rounded features 57. In this example, the value of the width between the sidewalls has remained as D1. The modified epitaxy template design of FIG. 7 also has different random recesses in the sidewalls of the modified epitaxy template design compared to the primary epitaxy template design shown in FIG. 5. The radius of curvature of the rounded features of the pattern placement feature is denoted by R.

In order to carry out the method, the mean placement error (used as the pattern fidelity statistic for this embodiment) may be calculated for the predicted pattern 56 relative to the target pattern 54 for the primary epitaxy template design 51. This may then be repeated for a family of primary epitaxy template designs, each with different random errors 55. The resulting family of mean placement errors may be then be averaged to give an overall mean placement error for patterns directed by the primary epitaxy template design.

This procedure may then be repeated for each value of feature radius R over a range of values of R between the sidewalls, over a variety of values of feature radius R, in order to establish a relationship between the feature radius R and the overall mean placement error. This function may then be used in order to optimize the overall mean placement error selection of a final epitaxy template design having a feature radius R which provides the lowest available overall mean placement error according to the function established.

For the embodiments exemplified here, trench width D and/or feature radius R has been used as a systematic variable. One or more alternative or additional variables and combinations of variables may be used for the optimization of a pattern fidelity statistic.

For each of the embodiments exemplified, the mean placement error has been used as a pattern fidelity statistic. One or more alternative or additional statistics may be used, for instance critical dimensional uniformity relative to the target pattern critical damage and uniformity.

FIG. 8 shows a schematic flow diagram setting out the steps according to an embodiment of a method in which both the trench width D and the feature radius R are varied together.

Firstly, a target pattern is established and this is used as a basis to prepare a simple primary template design aimed at directing block copolymer self-assembly in order to attempt to match the target pattern. From this primary template design, modified template designs $X(D_i, R_j)$ are created by varying D and R in respective ranges for each variable. For each modified template design, a family of designs is generated, where the family members are identical to the effective modified template design save that each family member has a different random error, providing a family of modified template designs $X(D_i, R_j, s_k)$ with $s_k$ representing the random errors, where for each $D_i, R_j$, k has a plurality of values.

For each value of k, corresponding to a design of the family $X(D_i, R_j, s_k)$, the placement error statistic $P(D_i, R_j, s_k)$ relative to the target pattern may be calculated, and then averaged over all k values to give a mean placement error statistic for the family of $P(D_i, R_j, \underline{s})$.

From a mapping of $P(D_i, R_j, \underline{s})$ as a function of D and R, the values of D and R corresponding to the lowest (i.e. best) mean placement error may be established.

One or more other systematic variables may be used instead of, or in addition to, D and R, and that any suitable stochastic variation to the designs may be applied for each set of systematic variables. One or more additional or alternative pattern fidelity statistics may be used to optimize the matching of the ordered pattern guided by the final epitaxy template design to the target pattern. The use of the mean placement error is merely an example.

FIG. 9 shows an embodiment of the computer 60 in further detail. It can be seen that the computer comprises a CPU (central processing unit) 61 which is configured to read and execute instructions stored in a volatile memory 62 which takes the form of a random access memory. The volatile memory 62 stores instructions for execution by the CPU 61 and data used by those instructions. For example, in use, a digital representation of an ordered pattern may be stored in the volatile memory 62.

The computer 60 further comprises non-volatile storage in the form of a hard disc drive 63. The digital representation of the predicted ordered pattern may be stored on the hard disc drive 63. The computer 60 may further comprise an I/O (input/output) interface 64 to which may be connected a peripheral device used in connection with the computer 60, such as a display 65 configured to display output from the computer 60. The display 65 may, for example, display a representation of the predicted ordered pattern. Additionally, the display 65 may display images generated by processing of the predicted ordered pattern. One or more input devices may also be connected to the interface 64. Such an input device may include a keyboard 66 and a mouse 67 which allow user interaction with the computer 60.

A network interface 68 may be provided to allow the computer 60 to be connected to an appropriate computer network so as to receive and/or transmit data from and to one or more other computing devices. The CPU 61, volatile memory 62, hard disc drive 63, I/O interface 64 and network interface 68, are connected together by a bus 69.

An embodiment of the invention provides one or more advantages over other methods for template design for direction of self-assembly of block copolymer. For example, the random error included in the method is used in order to simulate a random error which may be expected to occur in practical implementation of the formation and use of an epitaxy template for direction of self-assembly of block copolymer. By incorporating such a random error when optimizing the epitaxy template design, in addition to systematic variation of a design parameter, the final template design may be rendered less sensitive to the presence of such a random error which may be inevitable in practice.

It will be appreciated that aspects of the invention can be implemented in any convenient form. For example, an embodiment of the invention may be implemented by one or more appropriate computer programs which may be carried on appropriate carrier media which may be tangible carrier media (e.g. disks) or intangible carrier media (e.g. communications signals). An aspect of the invention may be implemented using a suitable apparatus which may specifically take the form of programmable computer running a computer program arranged to implement an embodiment of the invention.

An embodiment of the present invention relates to a lithography method. The lithography method may be used in processes for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. An embodiment of the invention is also of use to create regular nanostructures on a surface for use in the fabrication of integrated circuits, bit-patterned media and/or discrete track media for magnetic storage devices (e.g. for hard drives).

Lithography may involve applying several patterns onto a substrate, the patterns being stacked on top of one another such that together they form a device such as an integrated circuit. Alignment of each pattern with a previously provided pattern is a significant consideration. If patterns are not aligned with each other sufficiently accurately, then this may result in some electrical connections between layers not being made. This, in turn, may cause a device to be non-functional. A lithographic apparatus therefore usually includes an alignment apparatus, which may be used to align each pattern with a previously provided pattern, and/or with alignment marks provided on the substrate.

In this specification, the term "substrate" is meant to include any surface layers forming part of the substrate, or being provided on a substrate, such as other planarization layers or anti-reflection coating layers which may be at, or form, the surface of the substrate, or may include one or more other layers such as those specifically mentioned above with reference to particular embodiments of the invention.

The invention claimed is:

1. A method comprising:
providing a primary epitaxy template design,
modifying the primary epitaxy template design to generate a final epitaxy template design, wherein self-assembly of a block copolymer directed using contact by the block copolymer with a physical instance of the final epitaxy template design provides an ordered pattern of self-assembled block copolymer, with an improved pattern fidelity statistic, relative to a target pattern, compared to the pattern fidelity statistic obtained when self-assembly is directed by the primary epitaxy template design, and
configuring a manufacturing process to fabricate the physical instance of the final epitaxy template design for use with a self-assembly process of the block copolymer and/or communicating data to physical apparatus in order to fabricate the physical instance of the final epitaxy template design for use with a self-assembly process of the block copolymer,
wherein the final epitaxy template design is derived by:
modelling, by a hardware computer system, predicted ordered patterns of self-assembled block copolymer directed by modified epitaxy template designs generated from the primary epitaxy template design by systematically varying a design parameter in the modified epitaxy template designs, and
optimizing the pattern fidelity statistic for the predicted ordered patterns, relative to the target pattern, as a function of the varied design parameter for the modified epitaxy template designs, and
wherein an error is included in at least one of the epitaxy template designs prior to modelling the predicted ordered patterns, the error representing an error likely to occur in fabrication of a physical epitaxy template and/or in self-assembly of the block copolymer.

2. The method according to claim 1, wherein for each of one or more modified epitaxy template designs, a family of versions of that modified epitaxy template design is generated, each member of that family having that modified epitaxy template design with an error different from an error of each other family member,
wherein a pattern fidelity statistic, for the predicted ordered patterns relative to the target pattern, is calculated for each family member.

3. The method of claim 2, wherein the pattern fidelity statistic for each modified epitaxy template design is calculated by averaging a respective pattern fidelity statistic for each family member of the family of versions for that modified epitaxy template design.

4. The method of claim 1, wherein the pattern fidelity statistic is a placement error statistic, or a critical dimension uniformity statistic, or both.

5. The method of claim 1, wherein the varied design parameter is selected from the group consisting of: lithography resolution used to form the final epitaxy template design, a dimension of the design, a shape of a pattern placement feature, a frequency of pattern placement features, an angle between edges of the design, and any combination selected therefrom.

6. The method of claim 1, wherein the error is selected from the group consisting of: line edge roughness, line edge width variability, resist layer thickness variability, resolution variability, block copolymer layer thickness variability, and any combination selected therefrom.

7. The method of claim 1, wherein the predicted ordered patterns are modelled using a modelling method selected from the group consisting of: dynamic density functional theory, dissipative particle dynamics, Brownian dynamics, Monte Carlo simulation, cell dynamics, and any combination selected therefrom.

8. The method of claim 1, wherein the primary epitaxy template design is a design for a graphoepitaxy template or for a chemical epitaxy template.

9. The method of claim 1, implemented in a computer comprising a processor communicating with a memory.

10. The method of claim 1, further comprising:
using the physical instance of the final epitaxy template design on a substrate to direct actual self-assembly of a block copolymer into a physical an ordered pattern onto the substrate, and
using the physical ordered pattern as a resist for lithography of the substrate.

11. A non-transitory computer readable medium carrying a computer program comprising computer readable instructions that, when executed by a computer system, are configured to cause the computer system to at least perform the method of claim 1.

12. The non-transitory computer readable medium according to claim 11, wherein for each of one or more modified epitaxy template designs, a family of versions of that modified epitaxy template design is generated, each member of that family having that modified epitaxy template design with an error different from an error of each other family member,
wherein a pattern fidelity statistic, for the predicted ordered patterns relative to the target pattern, is calculated for each family member.

13. The non-transitory computer readable medium of claim 12, wherein the pattern fidelity statistic for each modified epitaxy template design is calculated by averaging a respective pattern fidelity statistic for each family member of the family of versions for that modified epitaxy template design.

14. The non-transitory computer readable medium of claim 11, wherein the pattern fidelity statistic is a placement error statistic, or a critical dimension uniformity statistic, or both.

15. The non-transitory computer readable medium of claim 11, wherein the varied design parameter is selected from the group consisting of: lithography resolution used to form the final epitaxy template design, a dimension of the design, a shape of a pattern placement feature, a frequency of pattern placement features, an angle between edges of the design, and any combination selected therefrom.

16. The non-transitory computer readable medium of claim 11, wherein the error is selected from the group consisting of: line edge roughness, line edge width variability, resist layer thickness variability, resolution variability, block copolymer layer thickness variability, and any combination selected therefrom.

17. The non-transitory computer readable medium of claim 11, wherein the predicted ordered patterns are modelled using a modelling method selected from the group consisting of: dynamic density functional theory, dissipative particle dynamics, Brownian dynamics, Monte Carlo simulation, cell dynamics, and any combination selected therefrom.

18. The non-transitory computer readable medium of claim 11, wherein the primary epitaxy template design is a design for a graphoepitaxy template or for a chemical epitaxy template.

19. A computer apparatus comprising:
a memory storing processor readable instructions, the processor readable instructions comprising instructions arranged to control the computer apparatus to carry out the method according to claim 1, and
a processor arranged to read and execute instructions stored in the memory.

20. A lithographic apparatus arranged to provide a target pattern onto a substrate, wherein the lithographic apparatus comprises a computer apparatus according to claim 19.

* * * * *